United States Patent
Kranz

[11] Patent Number: 6,046,643
[45] Date of Patent: Apr. 4, 2000

[54] RADIO-FREQUENCY SIGNAL GENERATOR

[75] Inventor: Christian Kranz, Ratingen Lintorf, Germany

[73] Assignee: Siemens Aktiengesellschaft, Munich, Germany

[21] Appl. No.: 09/107,356

[22] Filed: Jun. 30, 1998

[30] Foreign Application Priority Data

Jun. 30, 1997 [DE] Germany .................... 197 27 810

[51] Int. Cl.[7] .................................................. H03L 7/093
[52] U.S. Cl. ...................... 331/1 A; 331/25; 327/107; 375/376
[58] Field of Search .................. 331/25, 17, 1 A, 331/16, 18, 23, 10; 332/100, 127; 375/272, 274, 303, 305, 306, 376; 327/105, 107, 156, 159

[56] References Cited

U.S. PATENT DOCUMENTS

| 4,145,667 | 3/1979 | Messerschmitt . | |
|---|---|---|---|
| 4,706,040 | 11/1987 | Mehrgardt | 331/1 A |
| 5,373,255 | 12/1994 | Bray et al. | 331/1 A |
| 5,428,308 | 6/1995 | Maeda | 327/106 |
| 5,638,410 | 6/1997 | Kuddes | 375/357 |
| 5,656,976 | 8/1997 | Jung et al. | 331/18 |
| 5,663,685 | 9/1997 | Kesner | 331/1 A |
| 5,898,328 | 4/1999 | Shoji | 327/157 |

FOREIGN PATENT DOCUMENTS

0340870A2  11/1989  European Pat. Off. .

OTHER PUBLICATIONS

"An Integrated Bipolar Transmitter for DECT", S. Heinen et al., IEEE Radio Frequency Integrated Circuits Symposium, 997, pp. 127–130; Date: Sep., 1997.

*Primary Examiner*—Robert Pascal
*Assistant Examiner*—Henry Choe
*Attorney, Agent, or Firm*—Herbert L. Lerner; Laurence A. Greenberg; Werner H. Stemer

[57] ABSTRACT

A radio-frequency signal generator has a voltage-controlled oscillator for producing a radio-frequency signal. A frequency divider with a fixed division ratio has an input connected to the voltage-controlled oscillator and an output supplying a first clock signal. A first accumulator aggregates a first reference signal under the control of the first clock signal. A second accumulator aggregates a second reference signal under the control of a second clock signal. The aggregated signals are subtracted from one another, filtered through a digital filter, weighted and subsequently converted into an analog signal. The analog signal is filtered by an analog filter and fed to the voltage-controlled oscillator.

8 Claims, 1 Drawing Sheet

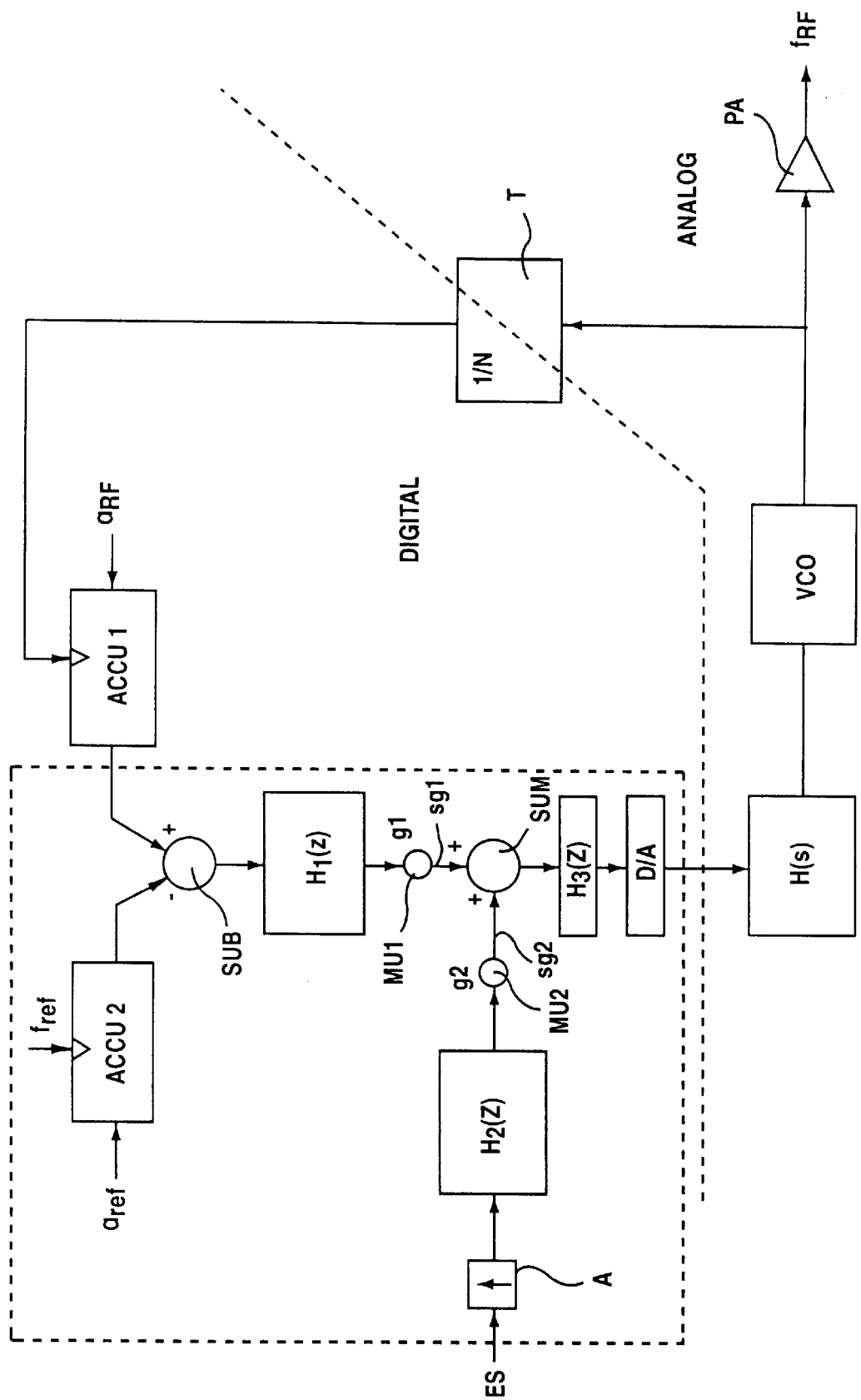

RADIO-FREQUENCY SIGNAL GENERATOR

BACKGROUND OF THE INVENTION

Field of the Invention

The invention relates to a radio-frequency signal generator. The signal generator is used for producing radio-frequency signals for digital communications equipment using continuous phase modulation.

Equipment which interchanges digital information through electromagnetic waves requires radio-frequency signals. The information is modulated onto the radio-frequency signals using suitable modulation methods.

In cordless telephones based on the DECT standard, a digital bit stream with a bit rate of 1152 kbit/s is produced as the information signal, which is also referred to below as an input signal. The abbreviation DECT stands for Digital Enhanced Cordless Telephone. A DECT network is a microcellular, digital mobile radio network for high subscriber densities. The DECT standard specifies the following layers: physical layer, medium access control layer, data link control layer and network layer. Further, the DECT standard describes a transport layer, a session layer, a presentation layer and an application layer. The physical layer divides the radio spectrum into physical channels. In addition to time and frequency, the dimension space and code are available. A TDMA method (Time Division Multiple Access) is used with 10 carrier frequencies. Those are in the frequency band from 1880 to 1900 MHz. At each carrier frequency, the TDMA structure has frames which are 10 ms long and each contain 24 time slots. One frame is transmitted every 10 ms for 470 µs. That results in a bit stream with a gross data rate of 1152 kbits per second. The carrier signal separation is 1728 MHz.

A publication entitled "An Integrated Bipolar Transmitter for DECT", 1997 IEEE, by S. Heinen, discloses a transmitter essentially including a tracking synchronization system, referred to below as a Phase-Locked Loop (PLL), with an output stage and a signal stage for the digital input signal. In a time period before a transmission interval, the PLL locks onto a nominal frequency, the control loop is opened when transmission begins, and the voltage-controlled oscillator (VCO) is modulated with the shaped digital signal. The output signal from the VCO is amplified in the output stage and transmitted by an antenna. Upon reception, the PLL forms a radio-frequency signal for mixing the input signal. In that case, the control loop of the VCO is not opened. All of the components in that circuit, with the exception of the dividers in the PLL, have an analog structure. Large-scale integration into a digital CMOS process is not possible.

SUMMARY OF THE INVENTION

It is accordingly an object of the invention to provide a radio-frequency signal generator, which overcomes the hereinafore-mentioned disadvantages of the heretofore-known devices of this general type and which as far as possible contains digital components, in order to allow large-scale integration in a digital CMOS process.

With the foregoing and other objects in view there is provided, in accordance with the invention, a high-frequency or radio-frequency signal generator, comprising a voltage-controlled oscillator for producing a radio-frequency signal; a frequency divider having an input connected to the voltage-controlled oscillator and an output supplying a first clock signal; a first accumulator aggregating a first reference signal under control of the first clock signal; a second accumulator aggregating a second reference signal under control of a second clock signal; a digital filter filtering a difference signal obtained from the two aggregated reference signals and supplying an output signal; a digital-analog converter producing an analog signal from the output signal of the first digital filter; and an analog filter filtering the analog signal fed to the voltage-controlled oscillator.

Advantageously, this makes it possible to produce the circuit more inexpensively. In addition, the analog loop filter in the PLL can thus be dispensed with.

In accordance with another feature of the invention, there is provided another digital filter filtering an input signal, and an adder connected between the first-mentioned digital filter, the other digital filter and the digital-analog converter.

In accordance with a further feature of the invention, there is provided an output stage amplifying the radio-frequency signal.

In accordance with an added feature of the invention, the frequency divider operates digitally and has a permanently set division ratio. The advantage of this development is that the permanent setting of the frequency divider ratio means that control signals and the complexity for a programmable divider usually used in such systems are eliminated.

In accordance with an additional feature of the invention, there is provided a device for weighting output signals from the digital filters.

In accordance with yet another feature of the invention, the analog signal from the digital-analog converter is kept constant, once the voltage-controlled oscillator has reached a steady state. By virtue of the fact that the analog signal from the digital-analog converter is kept constant, i.e. the digital-analog converter is frozen, after the VCO has been switched on, interference in the received signal due to quantization errors in the digital-analog converter can be suppressed. Therefore, the VCO receives a constant input voltage. The phase noise of the radio-frequency signal then depends essentially only on the VCO and on the introduction of interference.

In accordance with yet a further feature of the invention, the first digital filter is adaptive as a function of time. The time constant of the control loop can be shortened considerably by constructing the first digital filter to be adaptive as a function of time. This is of particular advantage for so-called fast hopping systems in which the carrier frequency has to be changed within a very short time.

In accordance with yet an added feature of the invention, the analog filter is constructed as a decimation filter with simultaneous oversampling by the digital-analog converter. This means that the accuracy of the digital-analog converter does not need to be so high.

In accordance with a concomitant feature of the invention, there is provided a further digital filter which can be inserted between the adder and the digital-analog converter. Other features which are considered as characteristic for the invention are set forth in the appended claims.

Although the invention is illustrated and described herein as embodied in a radio-frequency or high-frequency signal generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The FIGURE of the drawing is a block diagram of a circuit according to the invention.

DESCRIPTION OF THE PREFERRED EMBODIMENTS

Referring now in detail to the single FIGURE of the drawing, it is seen that a desired radio-frequency signal at a frequency $f_{RF}$ is produced by a voltage-controlled oscillator VCO and passed to an antenna through an output stage PA. A digital 1/N divider T generates a clock signal for a first accumulator ACCU1, which aggregates a digital signal $a_{RF}$ with each clock pulse. A second accumulator ACCU2 aggregates a digital signal $a_{ref}$ using a reference clock (clock frequency $f_{ref}$). The two accumulator output signals are fed to a subtractor SUB. An output signal from this subtractor is filtered by using a first digital filter $H_1(z)$ and is multiplied by a weighting factor g1. A first multiplier MU1 is provided for this purpose. An output signal from this multiplier is referred to as a first weighted filter output signal Sg1. This first weighted filter output signal Sg1 is fed to one input of an adder SUM. Another input of the adder SUM receives an input signal ES (input bit stream) which has been oversampled by using a sampling device A, digitally filtered by a second digital filter $H_2(z)$ and subsequently multiplied by a weighting factor g2 by a second multiplier MU2. A digital-analog converter D/A generates a proportional analog signal from a summation signal produced by the adder SUM. This signal is filtered in analog form by an analog filter H(s) and controls the voltage-controlled oscillator VCO.

A carrier frequency is set by a suitable selection of the digital signals $a_{RF}$ and $a_{ref}$. The stability or transient response of the circuit can be set through the use of the weighting factor g1, and the modulation amplitude can be set by the weighting factor g2.

In addition, a third digital filter $H_3(z)$ (shown in dashed lines) can be provided between the adder SUM and the digital-analog converter D/A.

The circuit according to the invention makes it possible to produce Frequency Shift Keying (FSK) (for example GMSK, Standard FSK, CPFSK) modulated signals with a continuous phase response. The FIGURE shows the digital part in the upper area and the analog part of the circuit in the lower area, divided by a dashed line. The only analog structures are the analog filter H(s), the voltage-controlled oscillator VCO and the output stage PA.

All of the components inside a dashed-line box can be produced on one chip.

I claim:

1. A radio-frequency signal generator, comprising:
   a voltage-controlled oscillator for producing a radio-frequency signal;
   a frequency divider having an input connected to said voltage-controlled oscillator and an output supplying a first clock signal;
   a first accumulator aggregating a first reference signal under control of the first clock signal;
   a second accumulator aggregating a second reference signal under control of a second clock signal;
   a first digital filter filtering a difference signal obtained from the two aggregated reference signals and supplying an output signal;
   a second digital filter filtering an input signal;
   a digital-analog converter producing an analog signal from the output signal of said first digital filter;
   an adder connected between said first digital filter, said second digital filter and said digital-analog converter; and
   an analog filter filtering the analog signal fed to said voltage-controlled oscillator.

2. The radio-frequency signal generator according to claim 1, including an output stage amplifying the radio-frequency signal.

3. The radio-frequency signal generator according to claim 1, wherein said frequency divider operates digitally and has a permanently set division ratio.

4. The radio-frequency signal generator according to claim 1, including a device for weighting output signals from said first digital filter and said second digital filter.

5. The radio-frequency signal generator according to claim 1, wherein the analog signal from said digital-analog converter is kept constant, once said voltage-controlled oscillator has reached a steady state.

6. The radio-frequency signal generator according to claim 1, wherein said first digital filter is adaptive as a function of time.

7. The radio-frequency signal generator according to claim 1, wherein said analog filter is a decimation filter with simultaneous oversampling.

8. The radio-frequency signal generator according to claim 1, including a third digital filter between said adder and said digital-analog converter.

* * * * *